United States Patent
Zhou et al.

(10) Patent No.: US 10,008,246 B2
(45) Date of Patent: Jun. 26, 2018

(54) MEMORY AND REFERENCE CIRCUIT CALIBRATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Yao Zhou, Shanghai (CN); Hao Ni, Shanghai (CN); Tian Shen Tang, Shanghai (CN); Tao Wang, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days. days.

(21) Appl. No.: 15/477,215

(22) Filed: Apr. 3, 2017

(65) Prior Publication Data

US 2017/0330602 A1  Nov. 16, 2017

(30) Foreign Application Priority Data

May 12, 2016 (CN) .......................... 2016 1 0315926

(51) Int. Cl.
*G11C 5/14* (2006.01)
*G11C 7/06* (2006.01)
(Continued)

(52) U.S. Cl.
CPC ................. *G11C 5/147* (2013.01); *G11C 7/06* (2013.01); *G11C 7/14* (2013.01); *G11C 29/026* (2013.01); *G11C 29/028* (2013.01)

(58) Field of Classification Search
CPC ........... G11C 5/147; G11C 7/06; G11C 5/145; G11C 29/028; G11C 29/026; G11C 7/14
(Continued)

(56) References Cited

U.S. PATENT DOCUMENTS 9,269,427 B2 * 2/2016 Nagey .................. G11C 11/165
2004/0109353 A1 6/2004 Matsuoka
(Continued)

OTHER PUBLICATIONS

The European Patent Office (EPO) The Extended European Search Report for 17169809.5 Oct. 5, 2017 7 Pages.

*Primary Examiner* — David Lam
(74) *Attorney, Agent, or Firm* — Anova Law Group, PLLC

(57) ABSTRACT

A memory and a reference circuit calibration method are provided. The memory includes: a memory array including a plurality of memory cells; a reference circuit including a reference memory cell and a reference connection terminal, wherein the reference memory cell is a same as the memory cell; a calibration circuit including a calibration connection terminal, and a mirror circuit including a first mirror terminal and a second mirror terminal, wherein the first mirror terminal is connected to the reference connection terminal, and the second mirror terminal is connected to the calibration connection terminal; a clamp circuit, configured to set one of a voltage of the reference connection terminal and a voltage of the calibration connection terminal as a preset voltage and to set the other thereof as a comparison voltage; and a comparison circuit configured to input the comparison voltage and the preset voltage, and to output a comparison result.

20 Claims, 3 Drawing Sheets

(51) Int. Cl.
    *G11C 7/14* (2006.01)
    *G11C 29/02* (2006.01)
(58) Field of Classification Search
    USPC ............... 365/189.06, 189.15, 189.09, 210.1
    See application file for complete search history.

(56) References Cited

U.S. PATENT DOCUMENTS

2007/0133319 A1   6/2007  Noichi
2008/0018318 A1*  1/2008  Hsu ..................... H02M 3/073
                                                  323/315
2010/0321976 A1  12/2010  Jung et al.
2012/0275212 A1* 11/2012  Jung ....................... G11C 7/06
                                                  365/148

* cited by examiner

MEMORY AND REFERENCE CIRCUIT CALIBRATION METHOD THEREOF

CROSS-REFERENCES TO RELATED APPLICATIONS

This application claims the priority of Chinese patent application No. 201610315926.9, filed on May 12, 2016, the entirety of which is incorporated herein by reference.

FIELD OF THE DISCLOSURE

The present disclosure generally relates to the field of semiconductor manufacturing technology and, more particularly, relates to a memory and reference circuit calibration method thereof.

BACKGROUND

A flash memory uses the flash technology to achieve storage of electronic information. The flash memory has many advantages such as driverless, fast speed, small size, desired compatibility, and large capacity, etc., and, therefore, has been widely used. The flash memory can perform read and write, erase and copy operations on data. Different operations have different drive circuits.

In the flash memory, the data is stored in two forms, '1' and '0', which correspond to two basic memory cells, an erase cell and a program cell, respectively. When the data in the flash memory is read, the type of the memory cell first needs to be determined, whether it is the program cell or the erase cell. When determining the type of the memory cell, a sense amplifier (SA) circuit needs to be used. An array formed by the sense amplifier circuits is usually referred to as a sense array. When the sense amplifier circuit reads the data in the flash memory, a reference signal needs to be used. By comparing the reference signal and a signal outputted from the memory cell, the type of the memory cell can be determined. Therefore, the reference signal is important for the accuracy of a reading result.

The reference signal is generated by a reference circuit. The design of the reference circuit directly impacts the output of the reference signal, and impacts the accuracy of the reading result. However, for existing flash memory, errors may easily occur in the reading result of the flash memory. The disclosed device structures and methods are directed to solve one or more problems set forth above and other problems.

BRIEF SUMMARY OF THE DISCLOSURE

One aspect of the present disclosure includes a memory. The memory includes a memory array including a plurality of memory cells, and a reference circuit including a reference memory cell and a reference connection terminal, wherein the reference memory cell is a same as the memory cell. The memory also includes a calibration circuit including a calibration, connection terminal, and a mirror circuit including a first mirror terminal and a second mirror terminal, wherein the first mirror terminal is connected to the reference connection terminal, and the second mirror terminal is connected to the calibration connection terminal. In addition, the memory includes a clamp circuit, configured to set one of a voltage of the reference connection terminal and a voltage of the calibration connection terminal as a preset voltage and to set the other thereof as a comparison voltage. Further, the memory includes a comparison circuit configured to input the comparison voltage and the preset voltage, and to output a comparison result.

Another aspect of the present disclosure includes a reference circuit calibration method. The method includes providing a memory, and adjusting the clamp circuit to set one of the voltage of the reference connection terminal and the voltage of the calibration connection terminal as a preset voltage. The method also includes adjusting the calibration circuit to generate a second current from the calibration connection terminal. In addition, the method includes adjusting the reference circuit to perform a weak programming on the reference memory cell, and to generate a first current from the reference connection terminal, wherein when the voltage of the reference connection terminal is the preset voltage, through the mirror circuit, the calibration connection terminal generates a mirror current corresponding to the first current as well as a comparison voltage; and when the voltage of the calibration connection terminal is the preset voltage, through the mirror circuit, the reference connection terminal generates a mirror current corresponding to the second current as well as a comparison voltage. Further, the method includes outputting the reference current from the reference connection terminal when the comparison voltage is equal to the preset voltage, determined by the comparison circuit.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the sane reference numbers will be used throughout the drawings to refer to the same or the alike parts.

A flash memory usually includes a reference circuit configured to generate a reference current, a memory cell configured to output a storage current, and a sense amplifier configured to input the storage current, and the reference current and to output a reading result. The reference circuit includes a plurality of current sources and resistors connected in series. The reference current is generated by the current sources and the resistors.

However, when the memory cell changes due to impact of external environment, the current sources and the resistors do not change, or change in a different way from the memory cell. Therefore, it is easy to cause the reference current to be larger than the storage current outputted from the memory cell in a programming state, or to cause the reference current to be smaller than the storage current outputted from the memory cell in an erasing state, thus resulting in the occurrence of errors in the reading result.

Figure 1:
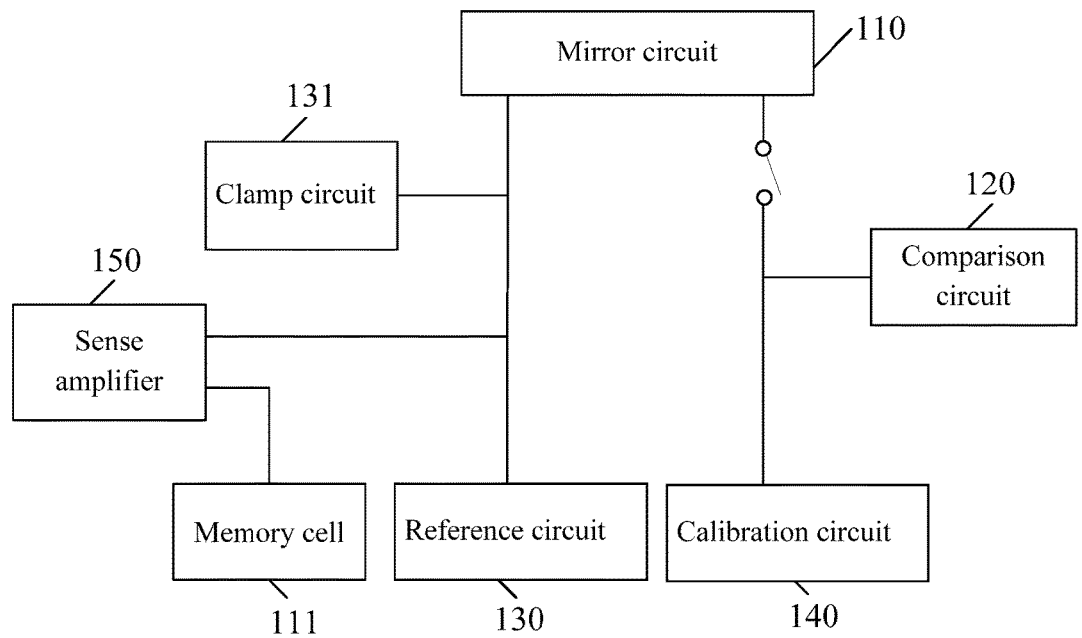
FIGS. 1-3 illustrate an exemplary memory consistent with the disclosed embodiments.
Figure 2:
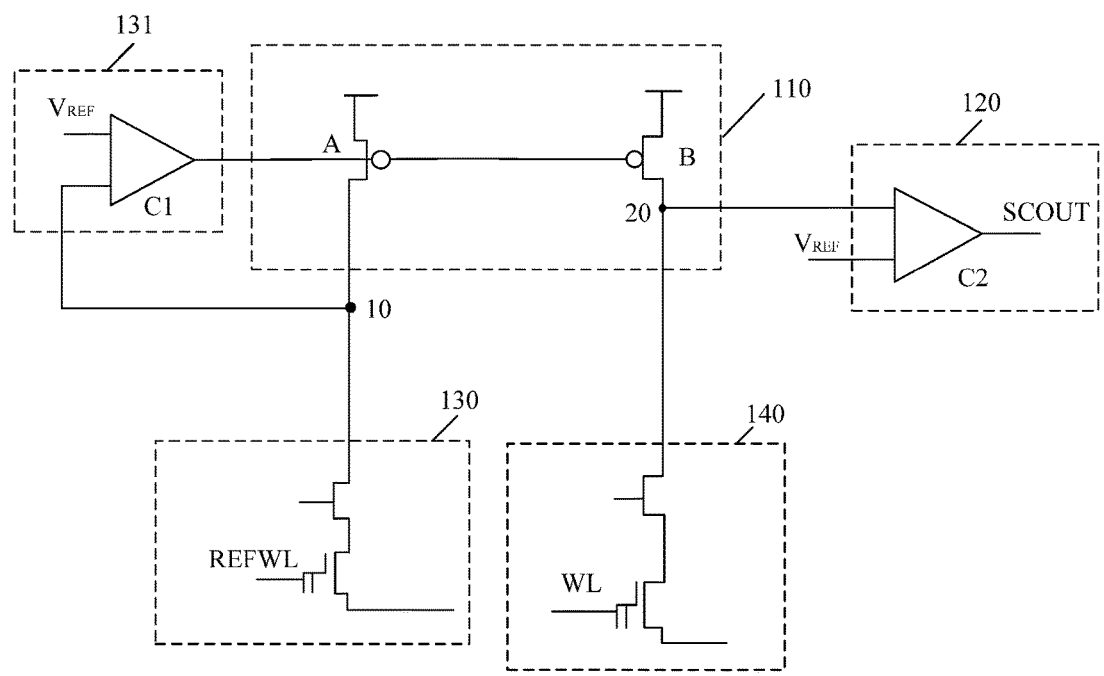
Figure 3:
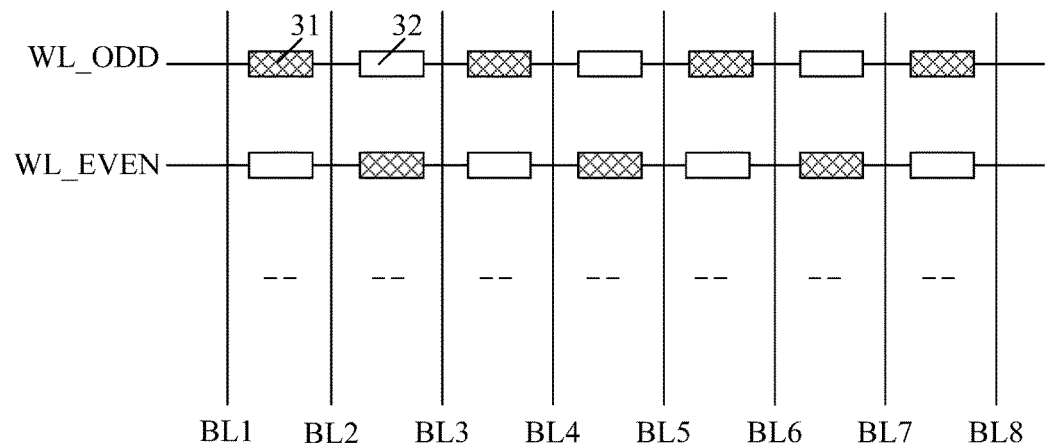

The present disclosure provides a memory and reference circuit calibration method. FIGS. 1-3 illustrate an exemplary memory consistent with the disclosed embodiments. Referring to FIG. 1, the memory may include a memory array, a reference circuit 130, a calibration circuit 140, a mirror circuit 110, a clamp circuit 131, and a comparison circuit 120. Other components or circuits may also be included.

The memory array may include a plurality of memory cells 111. The reference circuit 130 may include a reference memory cell and a reference connection terminal, and the reference memory cell may be the same as the memory cell 111. The calibration circuit 140 may include a calibration connection terminal.

The mirror circuit 110 may include a first mirror terminal and a second mirror terminal. The first mirror terminal may be connected to the reference connection terminal of the reference circuit 130 and the second mirror terminal may be connected to the calibration connection terminal of the calibration circuit 140.

The clamp circuit 131 may be configured to set the voltage of the reference connection terminal as a preset voltage, and to set the voltage of the calibration connection terminal as a comparison voltage. Or the clamp circuit 131 may be configured to set the voltage of the calibration connection terminal as a preset voltage, and to set the voltage of the reference connection terminal as a comparison voltage.

Further, the comparison circuit 120 may be configured to input the comparison voltage and the preset voltage, and to output a comparison result. The memory array may be configured to store digital information, and the memory cell 111 may be configured to output storage current.

In one embodiment, the memory array may include a plurality of the memory cells 111, and the memory cells 111 may be arranged in a matrix arrangement. In certain embodiments, the memory array may include program cells in a programming state and erase cells in an erasing state. The storage current outputted from the program cells may be programming current, and the storage current outputted from the erase cells may be erasing current. In one embodiment, the memory array may also include a plurality of word lines and a plurality of bit lines. The word lines and the bit lines may be configured to control the programming and erasing of the memory cells.

FIG. 2 is a circuit schematic of the memory in FIG. 1 consistent with the disclosed embodiments. Referring to FIG. 2, the reference circuit 130 (shown in FIG. 1) may be configured to output reference current. The reference current may be configured as a reference signal when data in the memory cell 111 (shown in FIG. 1) is read.

The reference circuit 130 may include the reference memory cell, and the reference memory cell may be the same as the memory cell 111. When the memory cell 111 changes due to impact of external environment, the reference memory cell may also undergo same changes as the memory cell 111.

In one embodiment, the reference memory cell may be configured for weak programming, and the outputted reference current may be smaller than the programming current. In another embodiment, the reference memory cell may be configured for erasing, and the outputted reference current may be larger than the erasing current. For example, in one embodiment, a ratio of the reference current to the programming current may be in a range of approximately 0.1-0.4. The program cells may change due to a variety of factors, causing the programming process to be incomplete and the programming current to be small, the programming current may not be smaller than the reference current. Thus, read errors may be difficult to occur. The erase cells may change due to a variety of factors, causing the erasing current to be large, the erasing current may not be larger than the reference current. Thus, read errors may be difficult to occur.

In one embodiment the reference circuit 130 (shown in FIG. 1) may also include a reference word line REFWL connecting to a gate of the reference memory cell, and a reference bit line connecting to a source of the reference memory cell. The reference bit line may be configured to apply a voltage, and to generate the reference current from the reference memory cell. The reference word line may be configured to apply a reference word line voltage, and to control the magnitude of the reference current.

In one embodiment, the calibration circuit 140 (shown in FIG. 1) may include a plurality of calibration memory cells. The calibration memory cells may be the same as the memory cells 111. The arrangement of the calibration memory cells may be the same as the arrangement of the memory cells 111. For example, in one embodiment, a plurality of the calibration memory cells may be arranged in a matrix arrangement to form a calibration memory array.

The calibration circuit 140 may be configured to output second current. The second current, may be similar to the programming current, and configured to calibrate the reference current, ensuring that the reference current may reach a preset value and be matched with the programming current. Therefore, read errors may be difficult to occur.

In one embodiment, the calibration circuit 140 may also include a plurality of calibration word lines WL and a plurality of calibration bit lines. In one embodiment, the calibration memory cells in the same row of the calibration memory array may share a same calibration word line WL. The calibration memory cells in the same column of the calibration memory array may share a same calibration bit line. In one embodiment, the calibration memory array may be a matrix with rows and columns. The number of columns of the calibration memory array may be in a range of approximately 4-16.

FIG. 3 is a schematic diagram of the calibration circuit 140 in FIG. 2. Referring to FIG. 3, in one embodiment, the calibration memory array may be a matrix with rows and eight columns. The calibration circuit 140 may include a plurality of the calibration word lines and eight calibration bit lines. The eight calibration bit lines may include a first calibration bit line BL1, a second calibration bit line BL2, a third calibration bit line BL3, a fourth calibration bit line BL4, a fifth calibration bit line BL5, a sixth calibration bit line BL6, a seventh calibration bit line BL7, and an eighth calibration bit line BL8.

In one embodiment, a plurality of the calibration word lines may include an odd calibration word line WL_ODD and an even calibration word line WL_EVEN. The calibration memory cells may include calibration program cells 32 configured for programming and calibration erase cells 31 configured for erasing.

Referring to FIG. 2, in one embodiment, the mirror circuit 110 (shown in FIG. 1) may include the first mirror terminal and the second mirror terminal. The first mirror terminal may be connected to the reference connection terminal 10, and be configured to generate the reference current. The second mirror terminal may be connected to the calibration connection terminal 20, and be configured to generate mirror current.

In one embodiment, a scaling factor of the mirror circuit 310 may be the ratio of the mirror current to the reference current. In one embodiment, the scaling factor of the mirror circuit 110 may be calculated by dividing the number of the columns of the calibration memory array by a value of approximately 0.1-0.4, and be configured to ensure the ratio of the reference current to the programming current is in a range of approximately 0.1-0.4. For example, in one embodiment, the number of the columns of the calibration memory array may be eight, therefore the scaling factor of the mirror circuit 110 may be in a range of approximately 20-80.

Referring to FIG. 2, in one embodiment, the mirror circuit 110 may include a first MOS transistor A and a second MOS transistor group B. A gate of the first MOS transistor may be connected to a gate of the second MOS transistor group B. In one embodiment, the first MOS transistor A may be a single MOS transistor, and gain of the first MOS transistor may be 1. In other words, gate current of the first MOS transistor may be the same as the current flowing through the reference connection terminal 10. In certain embodiments, the gate current of the first MOS transistor may be different from the current flowing through the reference connection terminal 10.

In one embodiment, the second MOS transistor group B may be a MOS transistor group formed by a cascade of a plurality of MOS transistors. In certain embodiments, the second MOS transistor group B may also be a single MOS transistor. In one embodiment, the gate of the second MOS transistor group B may be connected to the gate of the first MOS transistor A to form the mirror circuit 110.

In one embodiment, when the mirror current is equal to the second current, the voltage of the calibration connection terminal 20 may be equal to the voltage of the reference connection terminal 10. When the mirror current is larger than the second current, the voltage of the calibration connection terminal 20 may be larger than the voltage of the reference connection terminal 10. When the mirror current is smaller than the second current, the voltage of the calibration connection terminal 20 may be smaller than the voltage of the reference connection terminal 10.

The clamp circuit 131 (shown in FIG. 1) may be configured to set the voltage of the reference connection terminal 10 as a preset voltage $V_{REF}$, and to set the voltage of the calibration connection terminal 20 as a comparison voltage. Or the clamp circuit 131 may be configured to set the voltage of the calibration connection terminal 20 as the preset voltage $V_{REF}$, and to set the voltage of the reference connection terminal 10 as the comparison voltage.

In one embodiment, the clamp circuit 131 may include an operational amplifier C1. The operational amplifier C1 may include a first operational input terminal, a second operational input terminal, and an operational output terminal. In one embodiment, the first operational input terminal may be connected to the reference connection terminal 10. The second operational input terminal may be configured to apply the preset voltage $V_{REF}$. The operational output terminal may be connected to the gate of the first MOS transistor. Therefore, in one embodiment, the voltage of the reference connection terminal 10 may be the preset voltage $V_{REF}$, and the voltage of the calibration connection terminal 20 may be the comparison voltage.

When the mirror current is equal to the second current, the comparison voltage may be equal to the preset voltage $V_{REF}$. When the mirror current is larger than the second current, the comparison voltage may be larger than the preset voltage $V_{REF}$. When the mirror current is smaller than the second current, the comparison voltage may be smaller than the preset voltage $V_{REF}$.

In one embodiment, the comparison circuit 120 may include a comparison amplifier C2. The comparison amplifier C2 may include a first comparison terminal, a second comparison terminal, and a comparison output terminal SCOUT. In one embodiment, the first comparison terminal may be connected to the calibration connection terminal 20, and the second comparison terminal may be configured to apply the preset voltage $V_{REF}$.

In one embodiment, when the comparison voltage is larger than the preset voltage $V_{REF}$, the comparison result outputted from the comparison circuit 120 may be high level '1'. When the comparison voltage is smaller than the preset voltage $V_{REF}$, the comparison result outputted from the comparison circuit 120 may be low level '0'. In certain embodiments, when the comparison voltage is larger than the preset voltage $V_{REF}$, the comparison result outputted from the comparison circuit 120 may be low level '0'. When the comparison voltage is smaller than the preset voltage $V_{REF}$, the comparison result outputted from the comparison circuit 120 may be high level '1'.

Therefore, in one embodiment, when the mirror current is larger than the second current, the comparison voltage may be larger than the preset voltage $V_{REF}$, and the comparison amplifier C2 may output high level '1'. When the mirror current is smaller than the second current, the comparison voltage may be smaller than the preset voltage $V_{REF}$, and the comparison amplifier C2 may output low level '0'. Therefore, when the comparison result is in a failing edge or a rising edge, the comparison voltage may be equal to the preset voltage $V_{REF}$, and the mirror current may be equal to the second current. The reference current may be equal to the second current divided by the scaling factor of the mirror circuit 110, so as to obtain the required reference current.

The memory may also include a sense amplifier 150 (shown in FIG. 1). The sense amplifier 150 may be configured to input the storage current and the reference current, and to output the reading result. In one embodiment, the sense amplifier 150 may include a first input terminal, a second input terminal and an output terminal. The first input terminal may be configured to input the reference current. The second input terminal may be configured, to input the storage current. The output terminal may be configured to output the reading result.

For example, in one embodiment, when the storage current is larger than the reference current, the sense amplifier 150 may output high level '1'. When the storage current is smaller than the reference current, the sense amplifier 150 may output low level '0'.

Figure 4:
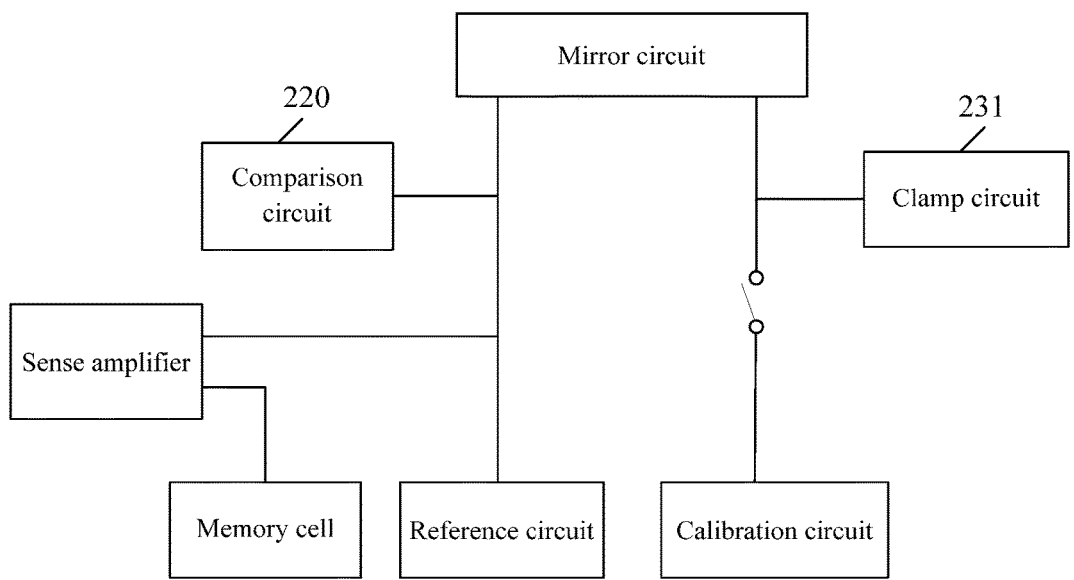
FIG. 4 illustrates another exemplary memory consistent with the disclosed embodiments.

FIG. 4 illustrates another exemplary memory consistent with the disclosed embodiments. The same or similar features of FIG. 4 and FIG. 1 are not repeated herein. The difference may include that in one embodiment, the clamp circuit 231 may be configured to set the voltage of the calibration connection terminal as the preset voltage, and to set the voltage of the reference connection terminal as the comparison voltage.

In one embodiment, the clamp circuit 231 may include an operational amplifier. The operational amplifier may include a first operational input terminal, a second operational input terminal, and an operational output terminal. In one embodiment, the first operational input terminal may be connected to the calibration connection terminal. The second operational input terminal may be configured to apply the preset voltage. The operational output terminal may be connected to the gate of the first MOS transistor.

In one embodiment, the comparison circuit 220 may include a comparison amplifier. The comparison amplifier may include a first comparison terminal, a second comparison terminal, and a comparison output terminal SCOUT. In one embodiment, the first comparison terminal may be connected to the reference connection terminal. The second comparison terminal may be configured to apply the preset voltage.

Accordingly, in the memory consistent with disclosed embodiments, the reference circuit may include the reference memory cell. The reference memory cell may be the same as the memory cell. The memory cell may change due to a variety of factors, the reference memory cell may undergo same changes as the memory cell. Therefore, the magnitude relationship between the current flowing through the reference circuit and the current flowing through the memory cell may be difficult to change, the probability of occurring read errors in the memory may be further reduced. Thus, read errors may be difficult to occur in the memory consistent with disclosed embodiments.

In addition, the calibration circuit may include calibration memory cells with rows and columns. The calibration memory cell may be the same as the memory cell. Thus, the calibration circuit may output the second current similar to the current outputted from the memory cells in the programming state, ensuring that the reference current may be matched with the current outputted from the memory cells in the programming state. Therefore, read errors may be difficult to occur in the memory.

Figure 5:
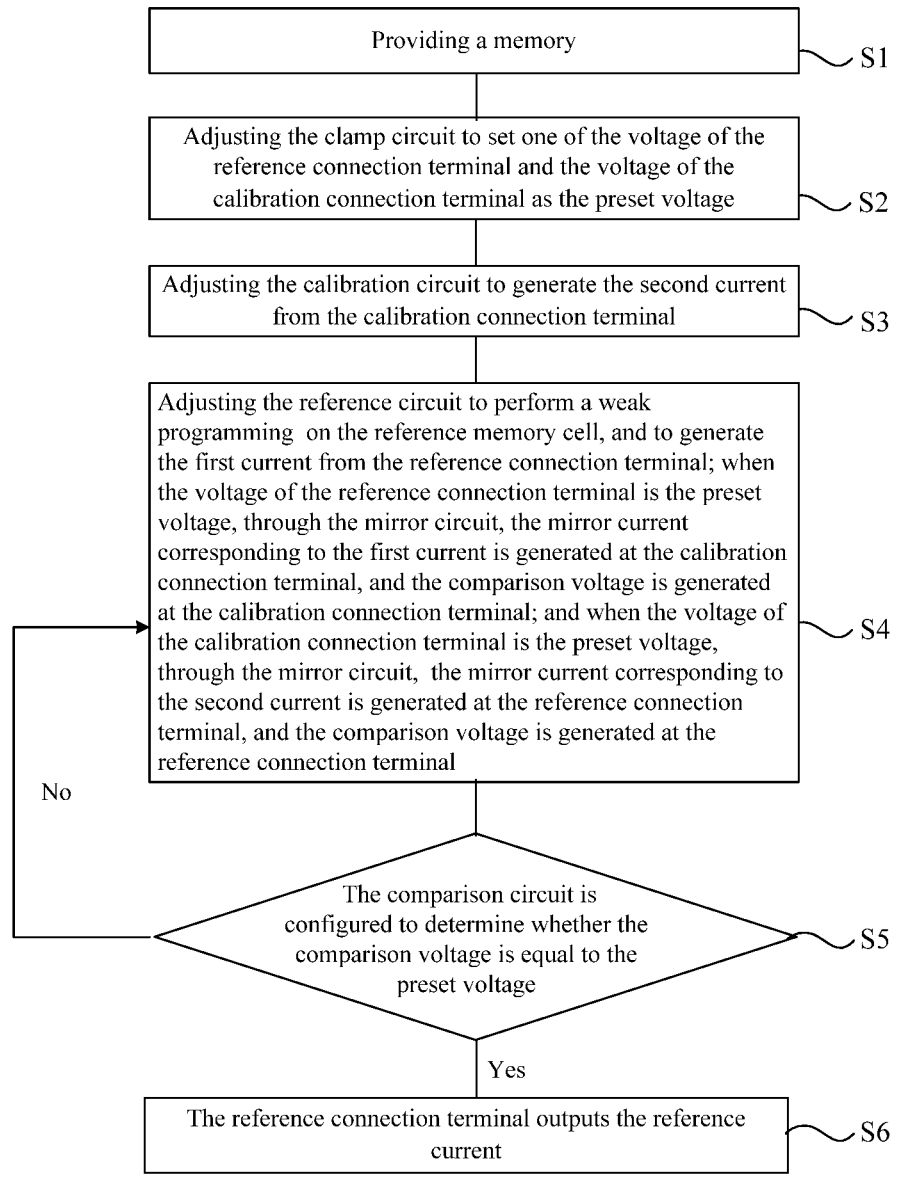
FIG. 5 illustrates as exemplary calibration process to calibrate a reference circuit of a memory consistent with the disclosed embodiments.

FIG. 5 illustrates an exemplary calibration process to calibrate the reference circuit of the memory consistent with the disclosed embodiments. Referring to FIG. 5, in Step S1 of the calibration process, a memory may be provided. In Step S2 of the calibration process, the clamp circuit may be adjusted to set the voltage of the reference connection terminal or the voltage of the calibration connection terminal as the preset voltage. In Step S3 of the calibration process, the calibration circuit may be adjusted to generate the second current from the calibration connection terminal.

In Step S4 of the calibration process, the reference circuit may be adjusted to perform a weak programming on the reference memory cell, and to generate the first current from the reference connection terminal. When the voltage of the reference connection terminal is the preset voltage, through the mirror circuit, the calibration connection terminal may generate the mirror current corresponding to the first current as well as the comparison voltage. Or when the voltage of the calibration connection terminal is the preset voltage, through the mirror circuit, the reference connection terminal may generate the mirror current corresponding to the second current as well as the comparison voltage.

In Step S5 of the calibration process, the comparison circuit may be configured to determine whether the comparison voltage is equal to the preset voltage. When the comparison voltage is equal to the preset voltage, in Step S6 of the calibration process, the reference connection terminal may output the reference current. When the comparison voltage is not equal to the preset voltage, the Step 4 of adjusting the reference circuit may be repeated.

Referring to FIG. 1 and FIG. 5, a memory may be provided (e.g. in Step S1). The memory may include a memory array, a reference circuit 130, a calibration circuit 140, a mirror circuit 110, a clamp circuit 131, a comparison circuit 120, and a sense amplifier 150.

The memory array may include a plurality of memory cells 111 configured to output storage current. The reference circuit 130 may include a reference memory cell and a reference connection terminal, and the reference memory cell may be the same as the memory cell 111. The calibration circuit 140 may include a calibration connection terminal configured to generate second current. The mirror circuit 110 may include a first mirror terminal and a second mirror terminal. The first mirror terminal may be connected to the reference connection terminal of the reference circuit 130 and the second mirror terminal may be connected to the calibration connection terminal of the calibration circuit 140. The clamp circuit 131 may be configured to set the voltage of the reference connection terminal as a preset voltage $V_{REF}$, and to set the voltage of the calibration connection terminal as a comparison voltage. Or the clamp circuit 131 may be configured to set the voltage of the calibration connection terminal as the preset voltage $V_{REF}$, and to set the voltage of the reference connection terminal as the comparison voltage. The comparison circuit 120 may be configured to input the comparison voltage and the preset voltage $V_{REF}$, and to output a comparison result. The sense amplifier 150 may be configured to input the storage current and the reference current, and to output a reading result.

In one embodiment, the memory array may include program cells in a programming state and erase cells in an erasing state. The storage current outputted from the program cells may be programming current, and the storage current outputted from the erase cells may be erasing current.

FIG. 2 is a circuit schematic of the memory in FIG. 1 consistent with the disclosed embodiments. Referring to FIG. 2, in one embodiment, the mirror circuit 110 may include a first MOS transistor A and a second MOS transistor group B. A gate of the first MOS transistor A may be connected to a gate of the second MOS transistor group B.

In one embodiment, the clamp circuit 131 (shown in FIG. 1) may include an operational amplifier C1. In one embodiment, the operational amplifier C1 may include a first operational input terminal, a second operational input terminal, and an operational output terminal. The operational output terminal may be connected to the gate of the first MOS transistor A. The first operational input terminal may be connected to the reference connection terminal 10 or the calibration connection terminal 20. The second operational input terminal may be configured to apply the preset voltage $V_{REF}$.

In one embodiment, the calibration circuit 140 may include a plurality of calibration memory cells, a plurality of calibration word lines and a plurality of calibration bit lines. A plurality of the calibration memory cells may be arranged to form a calibration memory array. In one embodiment, the calibration memory cells in the same row of the calibration memory array may share a same calibration word line. The calibration memory cells in the same column of the calibration memory array may share a same calibration bit line.

In one embodiment, the calibration memory array may be a matrix with rows and eight columns. The calibration circuit 140 may include a plurality of the calibration word lines and eight calibration bit lines. The eight calibration bit lines may include a first calibration bit line BL1, a second calibration bit line BL2, a third calibration bit line BL3, a fourth calibration bit line BL4, a fifth calibration bit line BL5, a sixth calibration bit line BL6, a seventh calibration bit line BL7, and an eighth calibration bit line BL8.

In one embodiment, the comparison circuit 120 may include a comparison amplifier C2. In one embodiment, the comparison amplifier C2 may include a first comparison terminal, a second comparison terminal, and a comparison output terminal SCOUT. The first comparison terminal may be connected to the calibration connection terminal 20. The second comparison terminal may be configured to apply the preset voltage $V_{REF}$. In certain embodiments, the first comparison terminal may be connected to the reference connection terminal 10. The second comparison terminal may be configured to apply the preset voltage $V_{REF}$.

Referring to FIG. 2 and FIG. 5, the clamp circuit 131 (shown in FIG. 1) may be adjusted (e.g. in Step S2) to set one of the voltage of the reference connection terminal 10 and the voltage of the calibration connection terminal 20 as the preset voltage $V_{REF}$.

In one embodiment, the clamp circuit 131 may be adjusted to set the voltage of the reference connection terminal 10 as the preset voltage $V_{REF}$. In certain embodiments, the clamp circuit 131 may also be adjusted to set the voltage of the calibration connection terminal 20 as the preset voltage $V_{REF}$.

In one embodiment, adjusting the clamp circuit 131 may include applying the preset voltage $V_{REF}$ on the second operational input terminal. In one embodiment, the first operational input terminal of the operational amplifier C1 may be connected to the operational output terminal of the operational amplifier C1 through the first MOS transistor A to form a feedback loop, which can clamp the voltage of the reference connection terminal 10 at the preset voltage $V_{REF}$.

The calibration process may also include adjusting the comparison circuit (shown in FIG. 1) to set the voltage of the second comparison input terminal as the preset voltage $V_{REF}$. In one embodiment, adjusting the comparison circuit 120 may include applying the preset voltage $V_{REF}$ on the second comparison input terminal of the comparison amplifier C2.

Referring to FIG. 2, FIG. 3 and FIG. 5, the calibration circuit 140 (shown in FIG. 1) may be adjusted (e.g. in Step S3) to generate the second current from the calibration connection terminal 20. In one embodiment, adjusting the calibration circuit 140 may include performing a programming process on a plurality of the calibration memory cells, to form calibration program cells 32; performing an erasing process on portions of the plurality of the calibration memory cells to form calibration erase cells 31; selecting two calibration word lines, where voltage may be applied onto the two selected calibration word lines and not be applied onto the other calibration word lines; and applying a voltage onto a plurality of the calibration bit lines to output a plurality of calibration current, from the plurality of the calibration bit lines, thus to form the second current.

For example, in one embodiment, erasing portions of the memory cells may include erasing the calibration memory cells in the calibration memory array with odd rows and odd columns; and erasing the calibration memory cells in the calibration memory array with even rows and even columns. In certain embodiments, erasing portions of the memory cells may include erasing the calibration memory cells in the calibration memory array with odd rows and even columns; and erasing the calibration memory cells in the calibration memory array with even rows and odd columns.

In one embodiment, selecting the two calibration word, lines may include selecting an odd calibration word line WL_ODD connecting to the calibration memory cells in the calibration memory array with odd row; and selecting an even calibration word line WL_EVEN connecting to the calibration memory cells in the calibration memory array with the even row.

In one embodiment, a voltage may be applied onto a calibration bit line connecting to the calibration memory cells in the odd row and a calibration bit line connecting to the calibration memory cells in the even row. Thus, the second current may include current flowing through the memory cells in the even row and current flowing through the memory cells in the odd row. Therefore, the difference between the calibration current and tire programming current caused by different positions of the selected calibration memory cells may be reduced, thus the calibration accuracy may be improved.

In one embodiment, the voltage applied to the odd calibration word line WL_ODD and the even calibration word line WL_EVEN may open a channel of the calibration program cells 32 and not open a channel of the calibration erase cells 31. In one embodiment, voltage may be applied onto the odd calibration word line WL_ODD and the even calibration word line WL_EVEN and not be applied onto the other word lines, thus channels of the calibration memory cells connected to the other calibration word lines may not be opened. Therefore, in one embodiment, only the channel of the calibration program cells 32 connected to the odd calibration word line WL_ODD and the even calibration word line WL_EVEN may be opened. After applying voltage onto the eight bit lines, each bit line may include current only flowing through one calibration memory cell, thus the accuracy of the second current outputted from the calibration circuit may be improved.

In one embodiment, voltage may be applied onto the eight bit lines, in certain embodiments, the number of columns of the calibration memory cells may be larger than eight. Approximately 4-16 calibration bit lines may be applied with a voltage.

In one embodiment, voltage may be applied onto the first calibration bit line BL1, the second calibration bit line BL2, the third calibration bit line BL3, the fourth calibration bit line BL4, the fifth calibration bit line BL5, the sixth calibration bit line BL6, the seventh calibration bit line BL7, and the eighth calibration bit line BL8. Therefore, a plurality of the calibration bit lines may output eight calibration current, including a first bit line current, a second bit line current, a third bit line current, a fourth bit line current, a fifth bit line current, a sixth bit line current, a seventh bit line current, and an eighth bit line current.

When voltage is applied onto fewer selected bit lines, the current flowing through the selected calibration memory cells may easily deviate from the programming current due to the impact of environmental and other factors. Applying voltage onto a plurality of bit lines can reduce the impact of the environmental and other factors on the second current by combining the first bit line current, the second bit line current, the third bit line current, the fourth bit line current, the fifth bit line current, the sixth bit line current, the seventh bit fine current, and the eighth bit line current, thus the calibration accuracy may be improved.

In one embodiment, the voltages applied onto the odd calibration word line WL_ODD and the even calibration word line WL_EVEN may be equal. The voltages applied onto the eight bit lines may be equal. Therefore, the first bit line current, the second bit line current, the third bit line current, the fourth bit line current, the fifth bit line current, the sixth bit line current, the seventh bit line current, and the eighth bit line current may be equal.

In one embodiment, the second current may be the sum of the first bit line current, the second bit line current, the third bit line current, the fourth bit line current, the fifth bit line current, the sixth bit line current, the seventh bit line current, and the eighth bit line current. In other words, the second current may be eight times of the calibration current.

In one embodiment, the mirror circuit 110 (shown in FIG. 1) may include the first mirror terminal and the second mirror terminal. The first mirror terminal may be connected to the reference connection terminal 10 and be configured to input the reference current. The second mirror terminal may be connected to the calibration connection terminal 20 and be configured to output the mirror current.

In one embodiment, a scaling factor of the mirror circuit 110 may be a ratio of the mirror current to the reference current. In one embodiment, the scaling factor of the mirror circuit 110 may be calculated by dividing the number of the bit lines applied voltage by a value of approximately 0.1-0.4. For example, the scaling factor of the mirror circuit 110 may be in a range of approximately 20-80.

In one embodiment, the calibration current may be the same as the programming current. In other words, the ratio of the reference current to the programming current may be in a range of approximately 0.1-0.4. The program cells may change due to a variety of factors, causing the programming process to be incomplete and the programming current to be small, the programming current may not be smaller than the reference current, thus read errors may be difficult to occur. The erase cells may change due to a variety of factors, causing the erasing current to be large, the erasing current may not be larger than the reference current, thus read errors may be difficult to occur. Therefore, the ratio of the reference current to the programming current in a range of approximately 0.1-0.4 can reduce the probability of occurring read errors.

Referring to FIG. 2 and FIG. 5, the reference circuit 130 (shown in FIG. 1) may be adjusted (e.g. in Step S4). A weak programming may be performed on the reference memory cell to generate the first current from the reference connection terminal 10. When the voltage of the reference connection terminal 10 is the preset voltage, through the mirror circuit 110 (shown in FIG. 1), the calibration connection terminal 20 may generate the mirror current corresponding to the first current as well as the comparison voltage. Or when the voltage of the calibration connection terminal 20 is the preset voltage, through the mirror circuit 110, the reference connection terminal 10 may generate the mirror current corresponding to the second current as well as the comparison voltage. In one embodiment, adjusting the reference circuit 130 may include performing a weak programming on the reference memory cell.

In one embodiment, the reference circuit 130 may include a reference word line (REFWL) and a reference bit line. Performing a weak programming on the reference memory cell may include adjusting the voltage applied onto the reference word line (REFWL) to output the first current from the reference bit line.

In one embodiment, the reference memory cell may be the same as the memory cell. When the memory changes due to impact of external environment, the reference memory cell may undergo same changes as the memory cell. Therefore, the magnitude relationship between the current flowing through the reference circuit and the current flowing through the memory cell may be difficult to change, the probability of occurring the read errors in the memory may be further reduced. Thus, read errors in the memory consistent with disclosed embodiments may be difficult to occur.

Referring to FIG. 1, FIG. 2 and FIG. 5, the comparison circuit 120 may be configured to determine whether the comparison voltage is equal to fee preset voltage (e.g. in Step S5). When the comparison voltage is equal to the preset voltage, the reference connection terminal 10 may output the reference current (e.g. in Step S6). When the comparison voltage is unequal to the preset voltage, the process of adjusting the reference circuit 130 (e.g. in Step S4) may be repeated.

In one embodiment, when the mirror current is larger than the second current, the comparison voltage may be larger than the preset voltage $V_{REF}$, and the comparison amplifier C2 may output high level '1'. When the mirror current is smaller than the second current, the comparison voltage may be smaller than the preset voltage $V_{REF}$, and the comparison amplifier C2 may output low level '0'. Therefore, when the comparison result is in a falling edge or a rising edge, the comparison voltage may be equal to the preset voltage $V_{REF}$, and the mirror current may be equal to the second current. The reference current may be equal to the second current divided by the scaling factor of the mirror circuit 110, thus the ratio of the reference current to the calibration current may be in a range of approximately 0.1-0.4, so as to obtain the required reference current.

Accordingly, in the calibration method consistent with the disclosed embodiments, the second current may be generated at the calibration circuit, and the reference circuit may be adjusted. When the comparison result changes, and when the comparison voltage is equal to the preset voltage, the reference connection terminal may output the reference current related to the second current. Therefore, the reference current may be matched with the second current, so as to achieve calibration of the reference circuit of the memory. Adjusting the reference circuit may include performing a weak programming on the reference memory cell. When the memory changes due to impact of external environment or the programming is incomplete, the reference memory cell may undergo same changes as the memory cell. Therefore, when the data in the memory cell is read, the magnitude relationship between the reference current and the current outputted from the memory cell may be difficult to change. Thus, read errors may be difficult to occur.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof without departing from the spirit and principle of the present disclosure, falls within the true scope of the present disclosure.

What is claimed is:

1. A memory, comprising:
   a memory array including a plurality of memory cells;
   a reference circuit including a reference memory cell and a reference connection terminal, wherein the reference memory cell undergoes same changes as the memory cell due to an impact of external environment;
   a calibration circuit including a calibration connection terminal, wherein the calibration circuit includes:
   a plurality of calibration memory cells;
   a plurality of calibration word lines; and
   a plurality of calibration bit lines;
   a mirror circuit including a first mirror terminal and a second mirror terminal, wherein the first mirror terminal is connected to the reference connection terminal, and the second mirror terminal is connected to the calibration connection terminal;
   a clamp circuit, configured to set one of a voltage of the reference connection terminal and a voltage of the calibration connection terminal as a preset voltage and to set the other thereof as a comparison voltage; and
   a comparison circuit configured to input the comparison voltage and the preset voltage, and to output a comparison result.

2. The memory according to claim 1, wherein the mirror circuit includes:

a first MOS transistor; and
a second MOS transistor group, wherein a gate of the first MOS transistor is connected to a gate of the second MOS transistor group.

3. The memory according to claim 2, wherein the clamp circuit includes:
an operational amplifier including a first operational input terminal, a second operational input terminal, and an operational output terminal,
wherein the first operational input terminal is connected to one of the reference connection terminal and the calibration connection terminal, the second operational input terminal is configured to apply the preset voltage, and the operational output terminal is connected to the gate of the first MOS transistor.

4. The memory according to claim 3, wherein the comparison circuit includes:
a comparison amplifier including a first comparison terminal, a second comparison terminal, and a comparison output terminal,
wherein the first comparison terminal is connected to the other of the reference connection terminal and the calibration connection terminal, and the second comparison terminal is configured to apply the preset voltage.

5. A reference circuit calibration method, comprising:
providing a memory according to claim 1;
adjusting the clamp circuit to set one of the voltage of the reference connection terminal and the voltage of the calibration connection terminal as a preset voltage;
adjusting the calibration circuit to generate a second current from the calibration connection terminal;
adjusting the reference circuit to perform a weak programming on the reference memory cell, and to generate a first current from the reference connection terminal,
wherein when the voltage of the reference connection terminal is the preset voltage, through the mirror circuit, the calibration connection terminal generates a mirror current corresponding to the first current as well as a comparison voltage; and when the voltage of the calibration connection terminal is the preset voltage, through the mirror circuit, the reference connection terminal generates a mirror current corresponding to the second current as well as a comparison voltage; and
outputting a reference current from the reference connection terminal when the comparison voltage is equal to the preset voltage, determined by the comparison circuit.

6. The method according to claim 5, wherein adjusting the calibration circuit includes:
programming a plurality of the calibration memory cells;
erasing portions of the plurality of the calibration memory cells;
selecting two calibration word lines;
applying a voltages onto the two selected calibration word lines; and
applying voltages onto a plurality of the calibration bit lines to output a plurality of calibration current from the plurality of the calibration bit lines, and to form the second current.

7. The method according to claim 6, wherein erasing portions of the calibration memory cells includes:
erasing the calibration memory cells in a calibration memory array with odd rows and odd columns; and
erasing the calibration memory cells in the calibration memory array with even rows and even columns.

8. The method according to claim 7, wherein selecting the two calibration word lines includes:
selecting a calibration word line connecting to the calibration memory cells in the calibration memory array with an odd row; and
selecting a calibration word line connecting to the calibration memory cells in the calibration memory array with an even row.

9. The method according to claim 6, wherein:
when performing the weak programming on the reference memory cell, the reference current is smaller than the calibration current.

10. The method according to claim 9, wherein:
the calibration current is the same as a programming current.

11. The method according to claim 9, wherein:
a ratio of the reference current over the calibration current is in a range of approximately 0.1-0.4.

12. The method according to claim 6, wherein:
when applying the voltages onto the plurality of the calibration bit lines,
approximately 4-16 calibration bit lines are applied with a voltage.

13. The method according to claim 5, wherein adjusting the reference circuit includes:
adjusting the voltage applied onto the reference word line to change the first current outputted from the reference bit line.

14. The method according to claim 5, wherein adjusting the clamp circuit includes:
applying the preset voltage onto a second operational input terminal of an operational amplifier.

15. The method according to claim 5, further including:
repeating the process of adjusting the reference circuit when the comparison voltage is unequal to the preset voltage.

16. A memory, comprising:
a memory array including a plurality of memory cells;
a reference circuit including a reference memory cell, and a reference connection terminal, wherein the reference memory cell undergoes same changes as the memory cell due to an impact of external environment;
a calibration circuit including a calibration connection terminal, wherein the calibration circuit includes:
a plurality of calibration memory cells;
a plurality of calibration word lines; and
a plurality of calibration bit lines,
wherein the calibration memory cell undergoes same changes as the memory cell due to an impact of external environment, a plurality of the calibration memory cells are arranged to form a calibration memory array, the calibration memory cells in a same row of the calibration memory array share a same calibration word line, and the calibration memory cells in a same column of the calibration memory array share a same calibration bit line;
a mirror circuit including a first mirror terminal and a second mirror terminal, wherein the first mirror terminal is connected to the reference connection terminal, and the second mirror terminal is connected to the calibration connection terminal;
a clamp circuit, configured to set one of a voltage of the reference connection terminal and a voltage of the calibration connection terminal as a preset voltage and to set the other thereof as a comparison voltage; and a comparison circuit configured to input the comparison voltage and the preset voltage, and to output a comparison result.

17. The memory according to claim 16, wherein:
the calibration memory array is a matrix with two rows and a plurality of columns.

18. The memory according to claim 16, further including:
approximately 4-16 columns of the calibration memory array.

19. The memory according to claim 16, wherein:
a scaling factor of the mirror circuit is calculated by dividing the number of columns of the calibration memory array by a value of approximately 0.1-0.4.

20. A reference circuit calibration method, comprising:
providing a memory, the memory comprising:
   a memory array including a plurality of memory cells;
   a reference circuit including a reference memory cell, and a reference connection terminal, wherein the reference memory cell undergoes same changes as the memory cell due to an impact of external environment;
   a calibration circuit including a calibration connection terminal;
   a mirror circuit including a first mirror terminal and a second mirror terminal, wherein the first mirror terminal is connected to the reference connection terminal, and the second mirror terminal is connected to the calibration connection terminal;
   a clamp circuit, configured to set one of a voltage of the reference connection terminal and a voltage of the calibration connection terminal as a preset voltage and to set the other thereof as a comparison voltage; and
   a comparison circuit configured to input the comparison voltage and the preset voltage, and to output a comparison result;
adjusting the clamp circuit to set one of the voltage of the reference connection terminal and the voltage of the calibration connection terminal as a preset voltage;
adjusting the calibration circuit to generate a second current from the calibration connection terminal;
adjusting the reference circuit to perform a weak programming on the reference memory cell, and to generate a first current from the reference connection terminal, wherein the reference circuit also includes:
   a reference word line; and
   a reference bit line;
   wherein performing the weak programming on the reference memory cell includes adjusting a voltage applied onto the reference word line to output the first current from the reference bit line,
wherein when the voltage of the reference connection terminal is the preset voltage, through the mirror circuit, the calibration connection terminal generates a mirror current corresponding to the first current as well as a comparison voltage; and when the voltage of the calibration connection terminal is the preset voltage, through the mirror circuit, the reference connection terminal generates a mirror current corresponding to the second current as well as a comparison voltage; and
outputting a reference current from the reference connection terminal when the comparison voltage is equal to the preset voltage, determined by the comparison circuit.

* * * * *